(12) United States Patent
Li

(10) Patent No.: US 12,093,610 B2
(45) Date of Patent: Sep. 17, 2024

(54) METHOD FOR MODELING AND DESIGNING A HELICAL SPRING

(71) Applicant: Shanghai Volvo Car Research and Development Co., Ltd., Shanghai (CN)

(72) Inventor: Gen Li, Shanghai (CN)

(73) Assignee: Shanghai Volvo Car Research and Development Co., Ltd., Shanghai (CN)

( * ) Notice: Subject to any disclaimer, the term of this patent is extended or adjusted under 35 U.S.C. 154(b) by 701 days.

(21) Appl. No.: 17/315,540

(22) Filed: May 10, 2021

(65) Prior Publication Data

US 2021/0374301 A1    Dec. 2, 2021

(30) Foreign Application Priority Data

May 27, 2020    (CN) .......................... 202010461413.5

(51) Int. Cl.
*G06F 30/15*    (2020.01)

(52) U.S. Cl.
CPC .................................... *G06F 30/15* (2020.01)

(58) Field of Classification Search
CPC .............. G06F 30/15; B60G 2206/426; B60G 2206/99
See application file for complete search history.

(56) References Cited

PUBLICATIONS

Chen et al. Spiral Profile Design and Parameter Analysis of Flexure Spring Cryogenics 46, 2006, pp. 409-419 (Year: 2006).*
Meier et al: "Geometrically exact beam elements and smooth contact schemes for the modeling of fiber-based materials and structures", 201 Olin Library Cornell University Ithaca, NY 14853, Nov. 19, 2016, pp. 1-33.
Ahmed et al: "Synthesis of Nonlinear Spiral Torsion Springs", International Journal of Engineering Research & technology, vol. 4, No. 6, Jun. 1, 2014, pp. 4-9.
Shin et al: "Numerical and Experimental Analysis of Torsion Springs Using NURBS Curves", Applied Sciences, vol. 10, No. 7, Apr. 10, 2020, p. 2629.

(Continued)

*Primary Examiner* — Rehana Perveen
*Assistant Examiner* — Cuong V Luu
(74) *Attorney, Agent, or Firm* — Clements Bernard Walker; Christopher L. Bernard

(57) ABSTRACT

A method of modeling and designing a helical spring, the helical spring including a top end turn (1), a top transition turn (2), an active turn (3), a bottom transition turn (4), and a bottom end turn (5) from top to bottom, the method including: utilizing first interpolation to determine the radius (R3) of the active turn (3), wherein the active turn (3) is as a function of the longitudinal overall length (L) of the helical spring; and utilizing second interpolation to determine the radius (R2) and the z-coordinate position (Z2) of the top transition turn (2) and the radius (R2) and the z-coordinate position (Z2) of the bottom transition turn (4), wherein each of the z-coordinate position (Z3($\theta$, L)) of the active turn (3), the radius (R2) and the z-coordinate position (Z2) of the top transition turn (2) and the radius (R2), and the z-coordinate position (Z2) of the bottom transition turn (4) is as a function of the longitudinal overall length (L) and the twist angle ($\theta$) of the helical spring.

9 Claims, 3 Drawing Sheets

(56) References Cited

PUBLICATIONS

Yang et al: "Modeling and dynamics of helical spring under compression using a curved beam element with consideration on contact between its coils", Meccanica, Kluwer Academic Publishers, Dordrecht, NL, vol. 49, No. 4, Nov. 20, 2013, pp. 907-917.
Sep. 20, 2021 Extended European Search Report issued in corresponding International Application No. 202010461413.5.

* cited by examiner

METHOD FOR MODELING AND DESIGNING A HELICAL SPRING

CROSS-REFERENCE TO RELATED APPLICATION

The present disclosure claims the benefit of priority of Chinese Patent Application No. 202010461413.5, filed on May 27, 2020, and entitled "Method for Modeling and Designing a Helical Spring," the contents of which are incorporated in full by reference herein.

TECHNICAL FIELD

The present disclosure generally relates to a method for modeling and designing a helical spring, particularly a method of modelling and designing a helical spring which is used as a spring element of a motor vehicle's suspension.

BACKGROUND

A helical spring acting as a spring element is a key factor in the design of a motor vehicle's suspension. Usually, three-dimensional modelling of the helical spring is carried out by a computer. Then, it is judged whether the three-dimensional model of the helical spring meets various requirements, and the model will be correspondingly revised so as to decide the final design of the helical spring.

In a conventional approach of designing the helical spring, the helical spring has to be modeled and designed beforehand. For instance, one approach is to three-dimensionally sweep a real helical spring in a free state, use a computer-aided mechanical design software such as CATIA to read the swept three-dimensional data, and accomplish computer's modeling, designing and verification by the computer-aided mechanical design software. For instance again, another approach is that after characteristic parameters of the helical spring such as radiuses of top and bottom end and active turns of the helical spring in its free state have been determined, the parameters of transition and active turns of the helical spring in the free state and various compressed states are artificially adjusted as a matter of personal experience so as to temporarily set three-dimensional data of the helical spring. If they do not meet the requirements, the parameters will be changed artificially as a matter of personal experience so as to obtain new three-dimensional data of the helical spring. Then, it will be judged again whether they could meet the requirements. Depending on the experience of a designer, this process may often require several rounds of changes, which thus is time consuming and laborious.

SUMMARY

One of the main purposes of the present disclosure is to propose a method by which it is ready to carry out three-dimensional modelling of a helical spring without one's personal experience, such that it is feasible to determine three-dimensional parameter information of the helical spring in various states for subsequent model computation and verification.

According to an aspect of the present disclosure, a method for modeling and designing a helical spring, particularly a helical spring used in a suspension of a motor vehicle is proposed, the helical spring including a top end turn, a top transition turn, an active turn, a bottom transition turn, and a bottom end turn from top to bottom, the method including:

taking the twist angle of the start point of the top end turn as a twist angle of zero to provide the twist angular position of the start point of the top transition turn, the twist angular position of the end point of the top transition turn, the twist angular position of the start point of the bottom transition turn, and the twist angular position of the end point of the bottom transition turn;

on the basis of the radius of the active turn in a free state of the helical spring, the longitudinal overall length of the helical spring in the free state, the longitudinal overall length of the helical spring in a tightly compressed state, the z-coordinate position of the top transition turn at the twist angle of the end point, the z-coordinate position of the bottom transition turn at the twist angle of the start point, and the diameter of the helical spring's helical wire, utilizing first interpolation to determine the radius of the active turn, wherein the active turn is as a function of the longitudinal overall length of the helical spring;

on the basis of the above parameters, the radius of the top end turn and the radius of the bottom end turn, and under the premise that the stiffness of the helical spring is the linear superposition of the stiffnesses of the top end, top transition, active, bottom transition, and bottom end turns, utilizing the first interpolation to determine the z-coordinate position of the active turn, and utilizing second interpolation to determine the radius and the z-coordinate position of the top transition turn and the radius and the z-coordinate position of the bottom transition turn, wherein each of the z-coordinate position of the active turn, the radius and the z-coordinate position of the top transition turn and the radius, and the z-coordinate position of the bottom transition turn is as a function of the longitudinal overall length and the twist angle of the helical spring. In this way, problems caused by repeated verification and low design efficiency due to the artificial determination of the parameters of the transition and active turns in the prior art can be avoided.

Preferably, the first interpolation is different than the second interpolation.

Optionally, the second interpolation includes but is not limited by Hermite's interpolation, Lagrange's interpolation, Newton's interpolation, or segmental interpolation.

Optionally, the radius and the z-coordinate position of the top transition turn, the radius and the z-coordinate position of the active turn, and the radius and the z-coordinate position of the bottom transition turn are converted into three-dimensional data which are readable by a three-dimensional mechanical design software. In this way, automatically modeling and designing a helical spring can be achieved by secondary development of an existing three-dimensional mechanical design software using a suitable computer programming language such as VBA.

Optionally, the three-dimensional mechanical design software is CATIA, UG, or PROE.

Optionally, the radiuses of the top end turn and the bottom end turn do not vary with the twist angle.

Optionally, the z-coordinate position of the top end turn does not vary with the twist angle and has a value equal to the longitudinal overall length of the helical spring, and the z-coordinate position of the bottom end turn does not vary with the twist angle and has a value of zero.

Optionally, if Hermite's interpolation is utilized to determine the radiuses and the z-coordinate positions of the top transition turn and the bottom transition turn, an Hermite polynomial of at most 3-order term is adopted.

Optionally, linear interpolation is used to determine the radius of the active turn, and the radius of the active turn is as a function of the longitudinal overall length of the helical spring.

Optionally, the linear interpolation is used to determine the z-coordinate position of the active turn.

Using the above technical measures according to the present disclosure, negative effects of the personal experience on the modelling and design of the helical spring can be eliminated so as to improve work efficiency and save the time of modeling the helical spring. In the meanwhile, three dimensional parameter data of the helical spring in different states can be determined so as to the application efficiency of the three-dimensional mechanical design software.

BRIEF DESCRIPTION OF THE DRAWINGS

The principle and various aspects of the present disclosure will be well understood by the following detailed description in combination of the attached drawings. It should be noted that for the sake of clarity the drawings may be provided in different ratios, which shall not affect to the scope of the present disclosure. In the drawings.

DETAILED DESCRIPTION OF EMBODIMENTS

Figure 1:
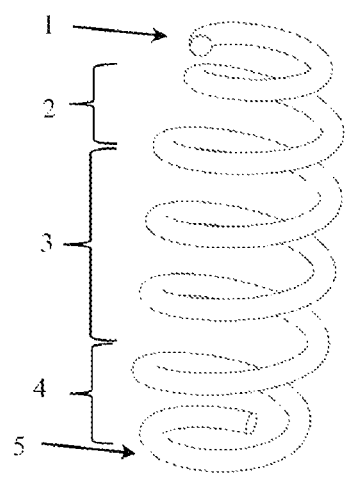
FIG. 1 is a perspective view schematically illustrating a helical spring in a free state.

In the drawings of the present disclosure, features having the same configuration or similar functions are represented by the same reference numerals.

Usually, in designing and verifying a three-dimensional model of a helical spring by a designer using a three-dimensional mechanical design software such as CATIA, the designer will first determine three-dimensional coordinate values of the helical spring to be designed in various states (such as a free state, differently compressed states). Next, these three-dimensional coordinate values are read by the three-dimensional mechanical design software to establish a three-dimensional model of the helical spring in the various states, so as to analyze and verify it.

Figure 2:
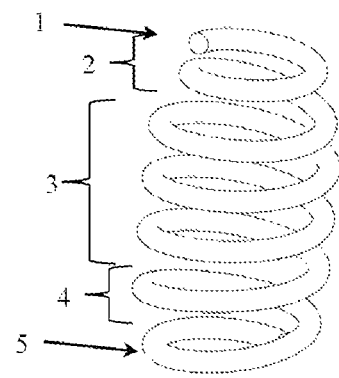
FIG. 2 is a perspective view schematically illustrating the helical spring of FIG. 1 in a compressed state.

As shown by FIGS. 1 and 2, generally, one helical spring includes two end turns, for example a top end turn 1 and a bottom end turn 5; an active turn 3, and a top transition turn 2 and a bottom transition turn 4 which are located between the active turn 3 and the top and bottom end turns 1, 5 respectively. When the helical spring is changed from its free state (as shown by FIG. 1) to its compressed state, the radius of the active turn 3 will become greater and the radiuses of the transition turns 2, 4 will also vary with the twist angle. In designing the helical spring, the radiuses of the top end turn 1, the bottom end turn 5, and the active turn 3 in the free state of the helical spring are known due to relevant design specifications. For instance, the radius of the helical spring's turn can refer to a distance measured from a helical line, passing through the center of mass of a cross-section of the helical spring's turn, to the longitudinal central axis of the helical spring. Of course, it should be understood by one ordinary person in the art that any other suitable location feature of the respective turn of the helical spring in a three-dimensional coordinate system can be used to define the radius of the helical spring's turn. For instance, the radius of the helical spring's turn can be defined alternatively as a distance from a helical line, passing through an internal tangent point of a cross-section of the helical spring's respective turn, to the longitudinal central axis of the helical spring.

With respect to the free and compressed states of the helical spring, it is necessary to determine the radiuses of the transition turns 2, 4 and the z-coordinate positions of transition turns 2, 4 and their relationships with the twist angle.

In the context of the present disclosure, the z-coordinate axis of the three-dimensional coordinate system is an axis coinciding with the longitudinal central axis of the helical spring, and the x-coordinate axis and the y-coordinate axis of the three-dimensional coordinate system are in a plane perpendicular to the z-coordinate axis and are perpendicular to each other. Particularly, the direction of the z-coordinate axis is along the direction of the longitudinal length of the helical spring. In the context of the present disclosure, the twist angle regarding the helical spring refers to the angle of a line passing through the z-coordinate axis as a center in in the x-y plane or a plane parallel to the x-y plane and sweeping from the start point of the top end turn about the z-coordinate axis.

According to the present disclosure, the radiuses of the transition turns 2, 4 and the z-coordinate positions of transition turns 2, 4 and their relationships with the twist angle are calculated by interpolation. In the technical solutions of the present disclosure, the interpolation includes but is not limited to Hermite's interpolation, Lagrange's interpolation, Newton's interpolation, segmental interpolation. In the description, the principle of the present disclosure will be exemplarily explained with respect to the Hermite's interpolation. It should be understood by the ordinary person in the art that any other suitable interpolations can be applied to the contents explained here.

No matter whether in the free or compressed state, the radiuses and the z-coordinate positions of the top, bottom and active turns 1, 5 and 3 vary with the twist angle about the longitudinal central axis of the helical spring. According to the present disclosure, the angular position of the start point of the top end turn 1 is assumed as zero. Therefore, no matter whether in the free or compressed state, the angular position $\theta_1$ of the end point of the top end turn 1 (i.e. the angular position of the start point of the top transition turn 2), the angular position $\theta_2$ of the start point of the active turn 3 (i.e. the angular position of the end point of the top transition turn 2), the angular position $\theta_3$ of the end point of the active turn 3 (i.e. the angular position of the start point of the bottom transition turn 4), the angular position $\theta_4$ of the start point of the bottom end turn 5 (i.e. the angular position of the end point of the bottom transition turn 4), and the angular position $\theta_5$ of the end point of the bottom end turn 5 can be determined in advance and constant. In the free state of the helical spring, the radius $R_1$ at the end point of the top end turn 1 (i.e. the radius at the start point of the top transition turn 2), the radius $R_2$ at the start point of the active turn 3 (i.e. the radius at the end point of the top transition turn 2), the radius $R_3$ at the end point of the active turn 3 (i.e. the radius at the start point of the bottom transition turn 4), the radius $R_4$ at the start point of the bottom end turn 5 (i.e. the radius at the end point of the bottom transition turn 4), and the radius $R_5$ at the end point of the bottom end turn 5 can be determined in advanced. Besides, the z-coordinate position $Z_{20}$ of the start point of the active turn 3 (i.e. the z-coordinate position of the end point of the top transition turn 2), the z-coordinate position $Z_{30}$ of the end point of the active turn 3 (i.e. the z-coordinate position of the start point of the bottom transition turn 4), and the overall length L of the helical spring along its longitudinal direction can be also determined in advance.

It is understood by the ordinary person in the art that there are 1-order, 2-order, . . . , n-order terms in Hermite polynomial, wherein n is an integer. In the technical solutions of the present disclosure, if the Hermite polynomial is adopted up to its 3-order term (i.e. n=3), the results obtained can ensure sufficient calculation accuracy. Therefore, the explanation will be given for the Hermite polynomial up to its 3-order term below.

For the top transition turn 2, due to the Hermite polynomial, the relationship between the radius of the top transition turn 2 and the twist angle is:

$$R_2(\theta) = R_1 + cr_2(\theta - \theta_1)^2 + dr_2(\theta - \theta_1)^3 \tag{1}$$

Figure 3:
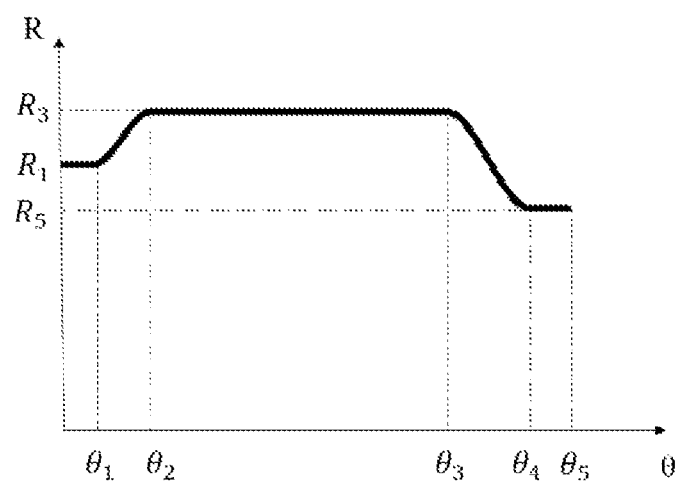
FIG. 3 is a diagram schematically illustrating a relationship of the radius of the helical spring vs. its twist angle.

In the above equation (1), $cr_2$ is a value which is relevant to the angular position $\theta_1$ of the start point of the top transition turn 2, the angular position $\theta2$ of the end point of the top transition turn 2, the radius $R_1$ at the start point of the top transition turn 2, and the radius $R_3$ of the active turn 3. As in the free state of the helical spring the $\theta_1$, $\theta_2$, $R_1$, and $R_3$ are definite values which can be determined in advance, the $cr_2$ is also a definite value. Furthermore, the $dr_2$ is a value which is relevant to the angular position $\theta_1$ of the start point of the top transition turn 2, the angular position $\theta_2$ of the end point of the top transition turn 2, the radius $R_1$ at the start point of the top transition turn 2, and the radius $R_3$ of the active turn 3. Therefore, the $dr_2$ is also a definite value. Using the equation (1), the relationship between the radius of the top transition turn 2 and the twist angle can be determined. Particularly for the free state of the helical spring, a graph can be directly plotted, as shown in FIG. 3.

Furthermore, concerning the bottom transition turn 4, due to the Hermite polynomial, the relationship between the bottom transition turn 4 and the twist angle is:

$$R_4(\theta) = R_3 + cr_4(\theta - \theta_3)^2 + dr_4(\theta - \theta_4)^3 \tag{2}$$

In the above equation (2), $cr_4$ is a value which is relevant to the angular position $\theta_3$ of the start point of the bottom transition turn 4, the angular position $\theta_4$ of the end point of the bottom transition turn 4, the radius $R_3$ of the active turn 3, and the radius $R_5$ of the end point of the bottom end turn 5. As in the free state of the helical spring the $\theta_3$, $\theta_4$, $R_3$, and $R_5$ are definite values which can be determined in advance, the $cr_4$ is a definite value. Furthermore, the $dr_4$ is a value which is relevant to the angular position $\theta_3$ of the start point of the bottom transition turn 4, the angular position $\theta_4$ of the end point of the bottom transition turn 4, the radius $R_{30}$ of the active turn 3, and the radius $R_{50}$ of the end point of the bottom end turn 5. Therefore, the value of $dr_4$ is also definite. Using the equation (2), the relationship between the bottom transition turn 4 and the twist angle can be determined. Particularly for the free state of the helical spring, the graph can be directly plotted, like in FIG. 3.

Therefore, using the equations (1) and (2), the relationship between the radius and the twist angle in the free or compressed state can be plotted. As shown in FIG. 3, a section of the graph (the top transition turn 2) from $\theta_1$ to $\theta_2$ is represented by the equation (1), and a section of the graph (the bottom transition turn 4) from $\theta_3$ to $\theta_4$ is represented by the equation (2).

Furthermore, concerning the top transition turn 2, due to the Hermite polynomial, the z-coordinate position of the top transition turn 2 vs. the twist angle is:

$$Z_2(\theta) = cz_2(\theta - \theta_1)^2 + dz_2(\theta - \theta_1)^3 \tag{3}$$

In the above equation (3), the $cz_2$ and $dz_2$ are values which are relevant to the angular position $\theta_1$ of the start point of the top transition turn 2, the angular position $\theta_2$ of the end point of the top transition turn 2, the z-coordinate position $Z_{20}$ of the end point of the top transition turn 2, and the z-coordinate position $Z_{30}$ of the start point of the bottom transition turn 4. As in the free state of the helical spring the $\theta_1$, $\theta_2$, $Z_{20}$, and $Z_{30}$ are definite values which can be determined in advance, the $cz_2$ and $dz_2$ are also definite values.

Furthermore, concerning the bottom transition turn 4, due to the Hermite polynomial, the relationship between the z-coordinate position of the bottom transition turn 4 and the twist angle is:

$$Z_4(\theta) = L + cz_4(\theta - \theta_4)^2 + dz_4(\theta - \theta_4)^3 \tag{4}$$

In the above equation (4), the $cz_4$ and $dz_4$ are values which are relevant to the angular position $\theta_3$ of the start point of the bottom transition turn 4, the angular position $\theta_4$ of the end point of the bottom transition turn 4, the z-coordination position $Z_{20}$ of the end point of the top transition turn 2, and the z-coordination position $Z_{30}$ of the start point of the bottom transition turn 4. L is the overall length of the helical spring along the z-axis. As in the free state of the helical spring the $\theta_3$, $\theta_4$, $Z_{20}$, $Z_{30}$, and L are definite values which can be determined in advance, the $cz_4$ and $dz_4$ are also definite values.

Figure 4:
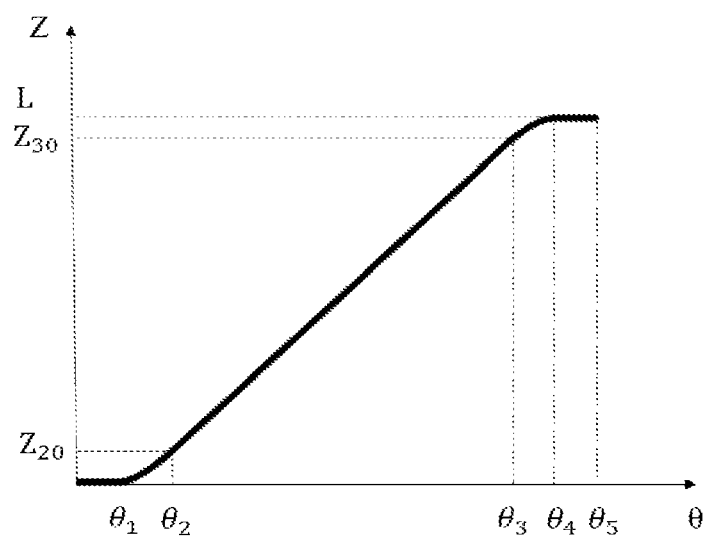
FIG. 4 is a diagram schematically illustrating a relationship of the axial length of the helical spring vs. its twist angle.

Therefore, using the above equations (3) and (4), the relationship between the z-coordinate position of the helical spring and the twist angle in the free or compressed state can be plotted. As shown in FIG. 4, the graph section (the top transition turn 2) from $\theta_1$ to $\theta_2$ is represented by the equation (3), and the graph section (the bottom transition turn 4) from $\theta_3$ to $\theta_4$ is represented by the equation (4). It should be understood by the ordinary person in the art that FIGS. 3 and 4 to reflect the relationships between the helical spring's radius, the z-coordinate position, and the twist angle in case of L having a definite value. For example, the maximal value of L refers to the free state of the helical spring; and in the compressed state of the helical spring, the value of L becomes less.

Next, various parameters of the helical spring in the compressed state will be determined. It should be noted that as the helical spring changes from the free state to the compressed state, the radius of the active turn 3 will correspondingly increase. Therefore, under consideration of National Standard GB/T 1239.6-2009 with interpolation (for instance linear interpolation), the relationship between the radius of the active turn 3 and the longitudinal length L of the helical spring in the compressed state is:

$$R_3 = R_{30} + \Delta R \frac{L_0 - L}{L_0 - L_S} \tag{5}$$

In the above equation (5), the $R_{30}$ is the radius of the active turn 3 in the free state, the $L_0$ is the overall length of the helical spring along the z-axis in the free state, the $L_s$ is the length of the helical spring in a tightly compressed state, the $\Delta R$ is the radius increment of the active turn 3 when the helical spring changes from the free state to the tightly compressed state, wherein the $\Delta R$ is a value which is relevant to the pitch of the active turn 3 in the free state of the helical spring, the diameter of the helical spring's helical wire (i.e. the diameter of a helical wire constituting the helical spring), and $R_{30}$. The tightly compressed state of the helical spring means a state in which the adjacent turns of the helical spring are in axial contact with each other. Since the $R_{30}$, the $L_0$, the $L_s$, the pitch of the active turn 3 in the free state of the helical spring, and the diameter of the helical wire of the helical spring are definite values which can be determined in advance, the equation (5) reflects how the radius of the active turn 3 in the compressed state of the helical spring varies with the longitudinal length L of the helical spring.

On the basis of the equation (5) in combination of utilization of the equations (1) and (2) respectively again, the relationships between the radius of the top and bottom transition turns 2 and 4 and the twist angle with variation of the longitudinal length L of the helical spring can be obtained.

According to the present disclosure, when the helical spring is deemed as being mainly comprised of the top transition turn, the active turn(s), and the bottom transition turn, those turns are considered as spring elements and the stiffness of the helical spring is the linear superposition of the stiffness of those spring elements. Under this premise, according to linear interpolation, in the compressed state, the relationship between the z-coordinate position of the active turn 3 and the twist angle in the compressed state is:

$$Z_3(\theta) = Z_{20}(L) + \frac{Z_{30}(L) - Z_{20}(L)}{\theta_3 - \theta_2}(\theta - \theta_1) \qquad (6)$$

wherein $$Z_{20}(L) = Z_{200} - \frac{\frac{K_{up}}{K_c}(L_0 - L)}{\frac{K_{up}}{K_c} + \frac{K_{lp}}{K_c} + 1} \qquad (7)$$

$$Z_{30}(L) = Z_{300} - \frac{\frac{K_{up}}{K_c}(L_0 - L)}{\frac{K_{up}}{K_c} + \frac{K_{lp}}{K_c} + 1} - \frac{(L_0 - L)}{\frac{K_{up}}{K_c} + \frac{K_{lp}}{K_c} + 1} \qquad (8)$$

In the equations (7) and (8), the $K_{upper}$, $K_{middle}$, and $K_{lower}$ are variables which are relevant to the shear modulus of material, the diameter of the helical spring's helical wire, and the twist angle respectively, and the twist angle; and the $Z_{200}$, and $Z_{300}$ are the z-coordinate position of the start point of the active turn 3 (i.e. the z-coordinate position of the end point of the upper transition turn 2) and the z-coordinate position of the end point of the active turn 3 (i.e. the z-coordinate position of the start point of the bottom transition turn 4) in the free state respectively. Therefore, the $Z_{20}(L)$ and $Z_{30}(L)$ depend on the longitudinal length L and the twist angle of the helical spring. That is, the relationship between the z-coordinate position $Z_3(\theta)$ of the active turn 3 and the twist angle also depends on the longitudinal length L and the twist angle of the helical spring. Therefore, using the above equation (6), the relationship between the z-coordinate position of the active turn 3 and the twist angle in the compressed state can be obtained. Basically, the relationships between the diameter, the z-coordinate position of the helical spring, and the twist angle in the compressed state are similar to the graphs as illustrated by FIGS. 3 and 4, i.e. they have generally similar trends.

Furthermore, after the equations (7) and (8) are substituted into the equations (3) and (4) respectively, the relationships between the z-coordinate position of the transition turns and the twist angle with variation of the longitudinal length L of the helical spring, in the compressed state of the helical spring, can be obtained.

Therefore, using the above introduced equations, the relationship between the radius, the z-coordinate position of the helical spring, and the twist angle in the free and compressed states can be obtained. Then, using the following equations (9), (10), (11), and (12), three-dimensional coordinate positional point sets (X, Y, Z) of the helical spring in the free and compressed states can be determined.

$$R(\theta, L) = \begin{cases} R_{10}, 0 \leq \theta \leq \theta_1 \\ R_2(\theta), \theta_1 < \theta \leq \theta_2 \\ R_3(\theta), \theta_2 < \theta \leq \theta_3 \\ R_4(\theta), \theta_3 < \theta \leq \theta_4 \\ R_{50}, \theta_4 < \theta \leq \theta_5 \end{cases} \qquad (9)$$

$$X(\theta, L) = R(\theta)\cos\theta \qquad (10)$$

$$Y(\theta, L) = R(\theta)\sin\theta \qquad (11)$$

$$Z(\theta, L) = \begin{cases} L_0, 0 \leq \theta \leq \theta_1 \\ Z_2(\theta), \theta_1 < \theta \leq \theta_2 \\ Z_3(\theta), \theta_2 < \theta \leq \theta_3 \\ Z_4(\theta), \theta_3 < \theta \leq \theta_4 \\ 0, \theta_4 < \theta \leq \theta_5 \end{cases} \qquad (12)$$

On the basis of the already introduced principle, an embodiment of a method for modeling and designing a helical spring according to the present disclosure will be explained below. It should be understood by the ordinary person in the art that the method or process described below can be implemented by a software, for example can be implemented as a secondary developed program in CATIA via the VBA language.

Figure 5:
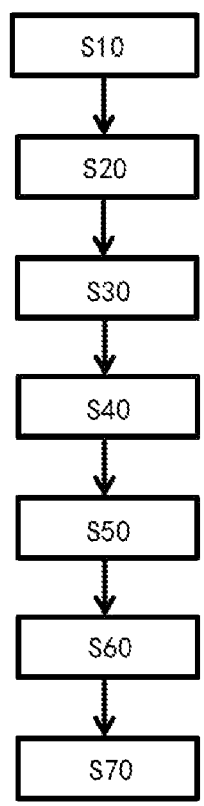
FIG. 5 is a flow chart schematically illustrating an embodiment of a method according to the present disclosure.

According to the method of the present disclosure, as shown in FIG. 5, at step S10, a three-dimensional coordinate system is first established, such as a Cartesian coordinate system. The z-axis of the coordinate system coincides with the longitudinal central axis of the helical spring, and the xy-plane is perpendicular to the z-axis and passes through the end point of the bottom end turn 5. At step S20, the twist angular position of the start point of the top end turn 1 is taken as the twist angular position of zero to determine the twist angular position $\theta_1$ of the start point of the top transition turn 2, the twist angular position $\theta_2$ of the end point of the top transition turn 2, the twist angular position $\theta_3$ of the start point of the bottom transition turn 4, and the twist angular position $\theta_4$ of the end point of the bottom transition turn 4.

At step S30, the radius $R_{30}$ of the active turn 3 in the free state of the helical spring, the longitudinal overall length $L_0$ of the helical spring in the free state, the longitudinal overall length $L_s$ of the helical spring in the tightly compressed state, the z-coordinate position $Z_{200}$ of the top transition turn 2 corresponding to the twist angular position of the end point, the z-coordinate position 2300 of the bottom transition turn 4 corresponding to the twist angular position $\theta_3$ of the start point, and the diameter of the helical spring's helical wire are determined.

At step S40, using the parameters involved by steps S20 and S30, the radius $R_3$ of the active turn 3 is determined by linear interpolation, wherein the radius $R_3$ of the active turn 3 is as a function of the longitudinal overall length L of the helical spring. For instance, under the premise that Hermite's interpolation is adopted, the equation (5) is used to determine the radius $R_3$ of the active turn 3.

At step S50, the radius $R_1$ of the top end turn 1 and the radius $R_5$ of the bottom end turn 5 are determined. Basically, in the context of the present disclosure $R_1$ and $R_5$ are assumed to be constants. That is, they are always constants no matter whether the helical spring is in the free or compressed state.

At step S60, under the premise that the stiffness of the helical spring is the linear superposition of the stiffness of the turns, the z-coordinate position $Z_3(\theta,L)$ of the active turn 3, the radius $R_2$ and the z-coordinate position $Z_2$ of the top transition turn 2, and the radius $R_4$ and the z-coordinate position $Z_4$ of the bottom transition turn 4 are determined by linear interpolation, wherein each of the z-coordinate position $Z_3(\theta,L)$ of the active turn 3, the radius $R_2$ and the z-coordinate position $Z_2$ of the top transition turn 2, and the radius $R_4$ and the z-coordinate position $Z_4$ of the bottom transition turn 4 is as a function of the longitudinal overall length L and the twist angle $\theta$ of the helical spring. For instance, under the premise that Hermite's interpolation is adopted, the equations (6), (1), (3), (2), and (4) are used to determine the z-coordinate position $Z_3(\theta,L)$ of the active turn 3, the radius $R_2$ and the z-coordinate position $Z_2$ of the top transition turn 2, and the radius $R_4$ and the z-coordinate position $Z_4$ of the bottom transition turn 4 respectively.

At step S70, the radius and the z-coordinate of the top end turn 1, the radius $R_2$ and the z-coordinate position $Z_2$ of the top transition turn 2, the radius $R_3$ and the z-coordinate position $Z_3(\theta,L)$ of the active turn 3, and the radius $R_4$ and the z-coordinate position $Z_4$ of the bottom transition turn 4 in the free and/or compressed state of the helical spring are converted into three-dimensional coordinate data which are readable by a three-dimensional mechanical design software such as CATIA. For instance, under the premise that Hermite's interpolation is adopted, the equations (9)-(12) can be used to implement the above conversion. It should be understood by the ordinary person in the art that the order of the steps mentions above can be adjusted as desired.

After the relevant three-dimensional coordinate data are read by the three-dimensional mechanical design software, the helical spring can be modeled correspondingly, and various verifications and inspections of the model can be carried out in a computer to determine whether the design of the helical spring is qualified.

Using the above mentioned technical measures of the present disclosure, it can greatly save the time of designing helical springs and improve the design efficiency. In the meanwhile, automatic modeling and designing a helical spring can be implemented by combination of the three-dimensional mechanical design software.

Although some specific embodiments of the present disclosure have been described in details here, they are given for illustrative purposes only and cannot be thought to constrain the scope of the present disclosure. Furthermore, it should be understood by the ordinary person in the art that without departing from the spirit and scope of the present disclosure, various replacements, alternations, and modifications can be thought out.

The invention claimed is:

1. A computer-implemented method for modeling and designing a helical spring, particularly a helical spring used in a suspension of a motor vehicle, the helical spring including a top end turn (1), a top transition turn (2), an active turn (3), a bottom transition turn (4), and a bottom end turn (5) from top to bottom, the method including:

establishing a start point in a computer for the modeling and designing the helical spring by setting a twist angle of the start point of the top end turn (1) as a twist angle of zero to provide a twist angular position ($\theta_1$) of the start point of the top transition turn (2), a twist angular position ($\theta_2$) of the end point of the top transition turn (2), a twist angular position ($\theta_3$) of the start point of the bottom transition turn (4), and a twist angular position ($\theta_4$) of the end point of the bottom transition turn (2);

utilizing a first interpolation in the computer to determine a radius ($R_3$) of the active turn (3) on the basis of a radius ($R_{30}$) of the active turn (3) in a free state of the helical spring, a longitudinal overall length ($L_0$) of the helical spring in the free state, a longitudinal overall length ($L_s$) of the helical spring in a tightly compressed state, a z-coordinate position ($Z_{200}$) of the top transition turn (2) at the twist angle of the end point, a z-coordinate position ($Z_{300}$) of the bottom transition turn (4) at the twist angle of the start point, and a diameter of the helical spring's helical wire, wherein the active turn (3) is as a function of a longitudinal overall length (L) of the helical spring;

utilizing the first interpolation in the computer to determine the z-coordinate position ($Z_3$ ($\theta$, L)) of the active turn (3), and utilizing second interpolation to determine the radius ($R_2$) and the z-coordinate position ($Z_2$) of the top transition turn (2) and the radius ($R_2$) and the z-coordinate position ($Z_2$) of the bottom transition turn (4) on the basis of the above parameters, a radius ($R_1$) of the top end turn (1) and a radius ($R_5$) of the bottom end turn (5), and under the premise that the stiffness of the helical spring is the linear superposition of the stiffnesses of the top end, top transition, active, bottom transition, and bottom end turns, wherein each of the z-coordinate position ($Z_3$ ($\theta$, L)) of the active turn (3), the radius ($R_2$) and the z-coordinate position ($Z_2$) of the top transition turn (2) and the radius ($R_2$), and the z-coordinate position ($Z_2$) of the bottom transition turn (4) is as a function of the longitudinal overall length (L) and a twist angle (0) of the helical spring; and making the designed helical spring for use in the suspension of the motor vehicle.

2. The computer-implemented method as recited in claim 1, wherein the first interpolation is different than the second interpolation.

3. The computer-implemented method as recited in claim 1, wherein the second interpolation includes but is not limited by Hermite's interpolation, Lagrange's interpolation, Newton's interpolation, or segmental interpolation.

4. The computer-implemented method as recited in claim 1, wherein the radius ($R_2$) and the z-coordinate position ($Z_2$) of the top transition turn (2), the radius ($R_3$) and the z-coordinate position ($Z_3$ ($\theta$, L)) of the active turn (3), and the radius ($R_4$) and the z-coordinate position ($Z_4$) of the bottom transition turn (4) are converted into three-dimensional data which are is readable by a three-dimensional mechanical design software.

5. The computer-implemented method as recited in claim 4, wherein the radiuses of the top end turn (1) and the bottom end turn (5) do not vary with the twist angle.

6. The computer-implemented method as recited in claim 5, wherein the z-coordinate position of the top end turn (1) does not vary with the twist angle and has a value equal to the longitudinal overall length of the helical spring, and the z-coordinate position of the bottom end turn (5) does not vary with the twist angle and has a value of zero.

7. The computer-implemented method as recited in claim 1, wherein if Hermite's interpolation is utilized to determine the radiuses and the z-coordinate positions of the top transition turn (2) and the bottom transition turn (4), an Hermite polynomial of at most 3-order term is adopted.

8. The computer-implemented method as recited in claim 1, wherein linear interpolation is used to determine the radius ($R_3$) of the active turn (3), and the radius ($R_3$) of the active turn (3) is as a function of the longitudinal overall length of the helical spring.

9. The computer-implemented method as recited in claim 8, wherein the linear interpolation is used to determine the z-coordinate position ($Z_3 (\theta, L)$) of the active turn (3).

* * * * *